US012785691B2

(12) United States Patent
Teh et al.

(10) Patent No.: US 12,785,691 B2
(45) Date of Patent: Nov. 3, 2026

(54) PROGRAMMABLE ROUTING BRIDGE

(71) Applicant: Altera Corporation, San Jose, CA (US)

(72) Inventors: J-Wing Teh, Gelugor (MY); Min Suet Lim, Gelugor (MY); Lai Guan Tang, Tanjung Bungah (MY); Md Altaf Hossain, Portland, OR (US); Gregory Steinke, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 280 days.

(21) Appl. No.: 17/856,768

(22) Filed: Jul. 1, 2022

(65) Prior Publication Data

US 2022/0337248 A1 Oct. 20, 2022

(51) Int. Cl.

*H03K 19/17736* (2020.01)
*H10W 70/60* (2026.01)
*H10W 70/62* (2026.01)
*H10W 90/00* (2026.01)

(52) U.S. Cl.

CPC .... *H03K 19/17736* (2013.01); *H10W 70/611* (2026.01); *H10W 70/641* (2026.01); *H10W 90/00* (2026.01); *H10W 90/724* (2026.01)

(58) Field of Classification Search

CPC .......... H03K 19/17736; H01L 23/5382; H01L 25/0655; H01L 25/18; H01L 24/16; H01L 2224/16225; H01L 24/17; H01L 2224/16145; H01L 2224/16227; H01L 2924/15192; H01L 25/0652; H01L 2924/15153; H01L 23/5385; H01L 2224/0401; H01L 2225/06513; H01L 2225/06517

See application file for complete search history.

(56) References Cited

U.S. PATENT DOCUMENTS

| | | | | |
|---|---|---|---|---|
| 10,886,218 | B2 * | 1/2021 | Teh | H03K 19/17704 |
| 2009/0089466 | A1 * | 4/2009 | Cunningham | H01L 25/18 710/100 |
| 2014/0264791 | A1 * | 9/2014 | Manusharow | H01L 23/5383 438/107 |
| 2017/0110407 | A1 * | 4/2017 | Chaware | H01L 23/5385 |
| 2019/0206798 | A1 * | 7/2019 | Collins | H01L 21/50 |

OTHER PUBLICATIONS

896-Pin FineLine Ball-Grid Array (FBGA)—Wire Bond—A:2.40, Altera Device Package Information, Dec. 2013, pp. 1-3.

Aptix facilitates "roll-your-own" prototypes, EDN Magazine, Nov. 12, 2002, pp. 1-7, https://www.edn.com/aptix-facilitates-roll-your-own-prototypes/?utm_source=eetimes&utm_medium=relatedcontent.

Schmitt, Stephen, et al., Verification of a Microcontroller IP Core for System-on-a-Chip Designs Using Low-Cost Prototyping Environments, Proceedings Design, Automation and Test in Europe Conference and Exhibition, Mar. 8, 2004, pp. 96-101, vol. 3.

* cited by examiner

*Primary Examiner* — Daniel D Chang
(74) *Attorney, Agent, or Firm* — Fletcher Yoder, PC

(57) ABSTRACT

Systems, methods, and devices are provided for configurable die-to-die communication between dies of an integrated circuit system using a programmable routing bridge. Such an integrated circuit system may include a first die on a substrate, a second die on the substrate, and a programmable routing bridge embedded in the substrate. The programmable routing bridge may be mounted to the first die and the second die and is configurable to transfer data between selectable points of the first die and selectable points of the second die.

18 Claims, 12 Drawing Sheets

PROGRAMMABLE ROUTING BRIDGE

BACKGROUND

The present disclosure relates generally to integrated circuit devices. More particularly, the present disclosure relates to a programmable routing bridge for flexible die-to-die communication to achieve high-capacity integrated circuits, such as high-capacity field programmable gate arrays (FPGAs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are found in numerous electronic devices, from handheld devices, computers, gaming systems, robotic devices, automobiles, and more. Many integrated circuit devices are constructed by assembling multiple dies on a package connected by a fixed interconnect (e.g., interposer or bridge) for signal transfer between the multiple dies. However, the use of a fixed interconnect may limit bandwidth and increases latency of die-to-die communication on the package. As such, the integrated circuit device may have limited bandwidth and increased latency for die-to-die communication as compared to intra-die communication. Moreover, the fixed interconnect generally may only provide fixed point-to-point communication from one location on a die to another location on another die. The behavior of certain integrated circuit devices in the field, such as programmable logic devices, however, may not be known by a manufacturer of the fixed interconnect. As such, the fixed interconnect may provide suboptimal routing between dies. This may further increase latency as the fixed interconnect may serve as a bottleneck or as signals may be further communicated through additional intra-die routing.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
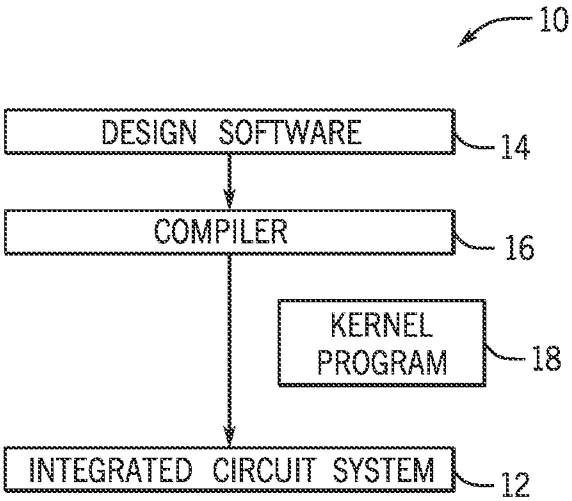
FIG. 1 is a block diagram of a process for implementing a system design on an integrated circuit system with a programmable routing bridge, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, programmable devices (e.g., FPGAs) may be initially unconfigured when manufactured. Subsequently, the programmable devices may be configured and even reconfigured to realize a circuit design via configuration data describing the circuit design. Additionally or alternatively, the programmable device may be partially reconfigured to change a portion of the circuit design (e.g., to switch circuit design personas). The term "program" may include the initial configuration of the programmable device and/or the partial configuration of a target partition(s) of the programmable device. Further, the term "reprogram" may include the reconfiguration of the programmable device and/or the partial reconfiguration of the target partition(s) of the programmable device once the programmable device has already been programmed.

The present disclosure describes systems and methods relating to a programmable routing bridge for flexible die-to-die communication to achieve high-capacity integrated circuits, such as field programmable gate arrays (FPGAs). To provide high-bandwidth, low-latency communication between multiple dies of an integrated circuit system, a programmable routing bridge may provide efficient point-to-point communication across dies, such as die-to-die communication. In one particular example, the integrated circuit system may include four dies mounted on a substrate and communicatively coupled by the programmable routing bridge. The programmable routing bridge may be an integrated circuit die (e.g., chip) embedded within the substrate or, in some cases, an interposer on which multiple dies are disposed. Indeed, while this disclosure refers to a programmable routing bridge, the systems and methods of this disclosure may also be used in an interposer. A surface of the programmable routing bridge may connect to (e.g., interface with) a surface of each of the four dies with any suitable interconnect structure (e.g., microbumps). Thus, the dies may mount to microbumps of the programmable routing bridge, creating the integrated circuit system.

Signals or data may be routed by the programmable routing bridge between the dies of the integrated circuit system using programmable routing of the type found in field programmable gate arrays (FPGAs) (e.g., an FPGA by Intel Corporation) or structured application specific integrated circuits (ASICs) (e.g., a structured ASIC such as eASIC™ by Intel Corporation). This stands in contrast to systems that use fixed die-to-die communication circuitry (e.g., an interposer, bridge, die-to-die interconnect) that provide fixed communication channels. In those systems, data destined from a first die to a third die may sometimes be routed from the first die to a second die before being passed on to the third die. Each hop between dies may introduce a latency (e.g., of approximately 1 nanosecond (ns)) while rerouting logic on the intervening dies may introduce additional latency (e.g., between 10 to 15 ns). Thus, a two-hop design from the first die to the second die to the third die may result in ten-fold or more increase in latency. The programmable routing bridge of this disclosure may reduce the number of hops within the integrated circuit device. For example, with the programmable routing bridge, the signals and/or data may be directed routed from the first die to the third die through the programmable routing bridge. That is, the programmable routing bridge may allow for one-to-one die communication to decrease die-to-die hops within the integrated circuit system. Indeed, the programmable routing bridge enables routing data in a one-hop design.

The programmable routing bridge may also implement mapping functions to reduce die-to-die hops within the integrated circuit system. Indeed, the mapping functions may define a configuration bitstream that may be separate from or part of a configuration bitstream storing the circuit design program (when the programmable routing bridge has FPGA-type routing circuitry) or a permanent programmable design (when the programmable routing bridge has structured ASIC circuitry). For example, a designer may program the programmable routing bridge with routing pathways (e.g., pathways based on the mapping functions) to route data between the first die and the third die or vice versa. As such, data may be routed directly from the first die to the third die. In another example, the designer may configure the routing pathway to route data between the fourth die and the second die or vice versa. In this way, the programmable routing bridge may be configurable to switch the routing pathway in different directions and allow for flexible die-to-die connection between the dies of the integrated circuit system. Accordingly, employing the programmable routing bridge between multiple dies of the integrated circuit system, one-to-one die connections may be created, which may improve bandwidth and latency of the system.

The dies may be communicatively coupled to one or more tiles for off-package data transfer. As used herein, a tile is a term for a die that has a specific purpose, usually to support another die (e.g., a tile may be a daughter die that provides input/output (I/O) circuitry or high speed serial interconnect (HSSI) circuitry to a mother die). For example, some tiles may be coupled to one or more edges of the die along a periphery of a package and may include transceivers to send or receive off-package data. As an aside, some tiles may be designed for die-to-die communication according to certain interfaces specific to certain dies. The programmable routing bridge may allow even dies designed for a one particular die-to-die interface to communicate with dies having different die-to-die interfaces by using programmable routing to connect to the die-to-die interfaces as appropriate. In some cases, this may allow dies to be connected to other dies (including tiles) in any manner. Thus, many dies may use the same die-to-die interface, allowing a first die and a second die that are to be placed in a different orientation to be identical (or nearly identical) dies that may be manufactured at the same time. Accordingly, the integrated circuit system may be created with identical dies communicatively coupled with the programmable routing bridge, which may involve fewer steps in the manufacturing process and may be more efficient. Likewise, this may also allow tiles supporting the first die or second die to be manufactured to be identical (or nearly identical).

In some examples, the programmable routing bridge may be a structured application specific integrated circuit (e.g., a structured ASIC such as eASIC™ by Intel Corporation). To manufacture the integrated circuit system, the manufacturer may pattern a first number of layers with a first set of masks. The manufacturer may use other masks to pattern one or more vias. The pattern of vias may effectively "program" the circuitry of the programmable routing bridge. In this way, the manufacturer may produce a routing bridge that allows the integrated circuit system to route data between the dies in a certain manner according to particular mapping functions. For example, the manufacturer may want data routed between a first die and a third die, without routing data through a second die. As such, the manufacturer may configure one or more via layers between metal layers to route data between the first die and third die. Connecting certain vias may have a similar effect on other circuit layers of the structured ASIC as storing configuration bits for routing data in an FPGA. As such, the manufacturer may implement the routing pathway by choosing whether to pattern or not to pattern different vias of the one or more via layers.

The integrated circuit system according to this disclosure may take any suitable form. One example is that of a programmable logic device that includes programmable logic circuitry (e.g., programmable logic fabric, FPGA).

FIG. 1 illustrates a block diagram of a system 10 used to design and/or configure an integrated circuit system 12 (e.g., a programmable logic device, an application specific integrated circuit (ASIC)). A designer may implement functionality on an integrated circuit, such as an integrated circuit system 12 that includes reconfigurable circuitry, such as an FPGA. The designer may program the integrated circuit system 12 with configuration data (e.g., defining a mapping function) for a circuit design (e.g., which may include data routing between individual dies) within the system 12. A designer may implement a circuit design to be programmed onto the integrated circuit system 12, which may include multiple dies in a package, using design software 14, such as a version of QUARTUS® by INTEL CORPORATION. The design software 14 may use a compiler 16 to generate a low-level circuit-design, which may be provided as a kernel program 18, sometimes known as a program object file or bitstream that programs the integrated circuit system 12. That is, the compiler 16 may provide machine-readable instructions representative of the circuit design to the integrated circuit system 12. For example, the programmable logic device 40 may receive one or more programs (e.g., bitstreams) 18 that describe the hardware implementations that should be stored in the programmable logic device as a configuration program 20. That is, the compiler 16 may provide machine-readable instructions representative of the circuit design to the programmable logic device. The configuration data may program the entire programmable fabric of the programmable device, one or more target partitions of the programmable fabric, and/or reprogram the programmable fabric as needed.

Figure 2:
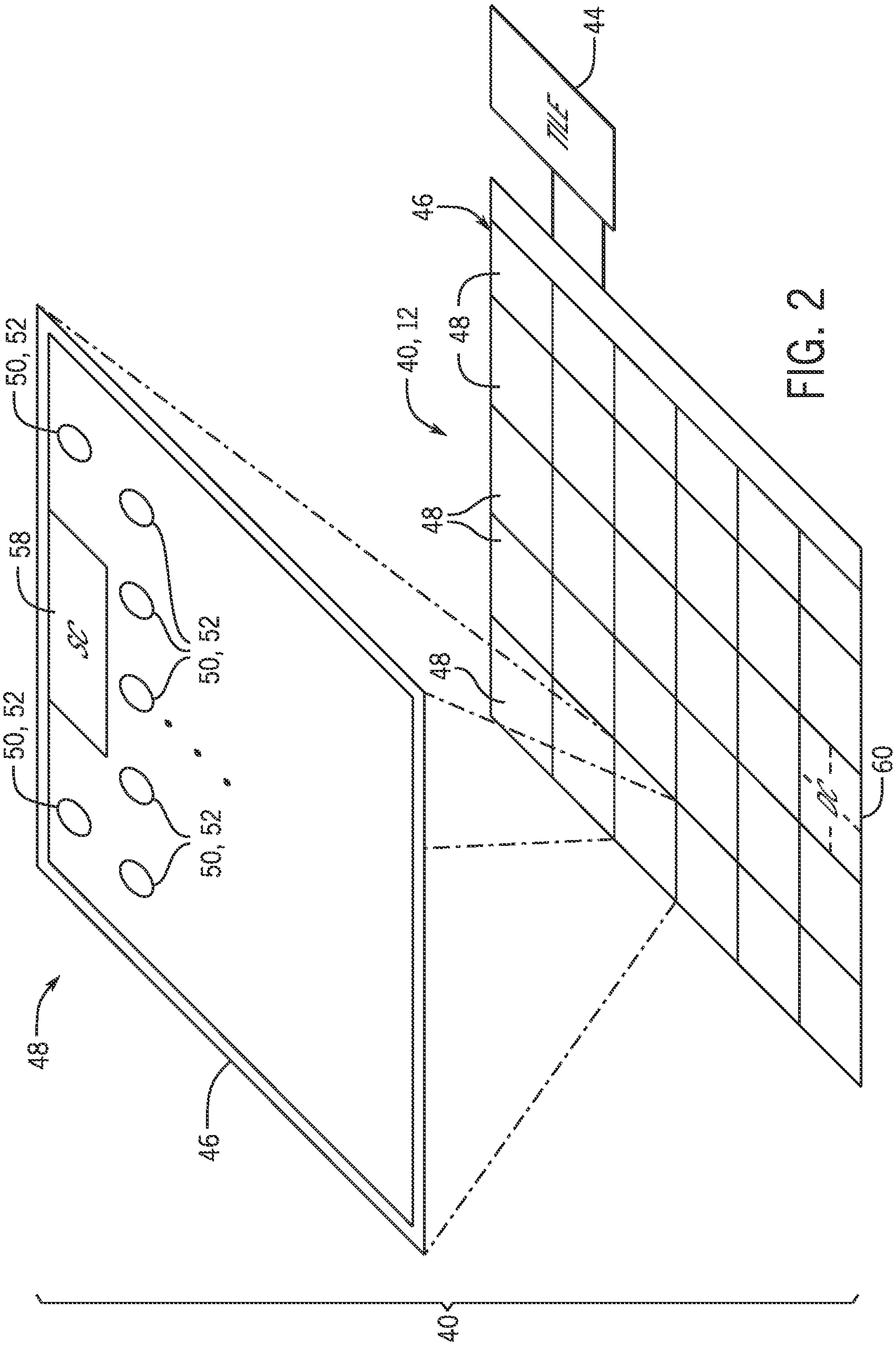
FIG. 2 is a block diagram of an example logical arrangement of the integrated circuit system in the form of a field programmable gate array (FPGA), in accordance with an embodiment of the present disclosure.

The integrated circuit system 12 may include any programmable logic device, such as a field programmable array (FPGA) 40, as shown in FIG. 2. For the purposes of this example, the FPGA 40 is referred to as a FPGA, though the device may be any suitable type of programmable logic device (e.g., an application-specific integrated circuit and/or application-specific standard product). The FPGA 40 may be formed on a single plane. In some embodiments, the FPGA 40 may be a three-dimensional FPGA having a base die and a fabric die.

In the example of FIG. 2, the FPGA 40 may be communicatively coupled to a tile 44 that may drive signals off the FPGA 40 and for receiving signals from other devices. For example, the tile 44 may be an I/O tile that is a non-programmable die configured to implement high speed I/O interfaces. In another example, the tile 44 may include a transceiver that may include and/or use input-output circuitry for driving signals off the FPGA 40 and for receiving signals from other devices. Interconnection resources 46 may be used to route signals, such as clock or data signals, through the FPGA 40. The FPGA 40 of FIG. 2 is sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry for performing the functionality programmed by the configuration data. For example, the programmable logic elements 50 may include look-up tables, registers, multiplexers, routing wires, and so forth. A designer may program the programmable logic elements 50 to perform a variety of desired functions.

To program the sectors 48, the configuration data associated with the circuit design may be stored in the configuration memory 52 of the appropriate programmable logic elements 50. As such, the sectors 48 and logic elements 50 may include additional logic elements to facilitate the storage of configuration data, such as wires, gates, and registers. For example, during programming, the configuration data may be loaded into data registers and subsequently into the configuration memory 52 using pins and input/output circuitry. Additionally or alternatively, a power supply may provide a source of voltage and current to a power distribution network (PDN) that distributes electrical power to the various components of the FPGA 40. Operating the circuitry of the FPGA 40 causes power to be drawn from the power distribution network.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 1, 5, 10, 50, 100, 500, 1000, 5000, 10,000, 50,000, or 100,000 sectors or more). Different programmable logic sectors 48 may include a sector controller (SC) 58 that controls the operation of the programmable logic sectors 48. Each sector controller 58 may be in communication with a device controller (DC) 60. Each sector controller 58 may accept commands and data from the device controller 60 and may read data from and write data into its configuration memory 52 based on control signals from the device controller 60. In addition to these operations, the sector controller 58 may be augmented with numerous additional capabilities. For example, such capabilities may include locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data (e.g., mapping function) is loaded into the configuration memory 52 using pins and input/output circuitry. In one example, the configuration memory 52 may be implemented as configuration random-access-memory (CRAM) cells. As discussed below, in some embodiments, the configuration data may be loaded into the FPGA 40 using an update to microcode of the processor in which the FPGA 40 is embedded. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to the gates of metal-oxide-semiconductor (MOS) transistors that control the states of the programmable logic elements 50, or programmable components of the interconnection resources 46.

The programmable elements 50 of the FPGA 40 may also include some communication wires to transfer a signal. In an embodiment, the programmable logic sectors 48 may be provided in the form of vertical routing channels (e.g., interconnects formed along a y-axis of the FPGA 40) and horizontal routing channels (e.g., interconnects formed along an x-axis of the FPGA 40). The FPGA 40 may include one or more function blocks 76, which may be partial reconfiguration regions of the programmable logic elements 50 of the FPGA 40 that may be modified (i.e. partially reconfigured) to implement new logic. The function blocks may implement logic that performs a particular task, such as routing data, which may be user-defined. Data, such as communication packets, may be transferred between the function blocks and/or the interconnection resources 46 of the FPGA 40. Further, the interconnection resources 46 may enable data to be transmitted and received by the FPGA 40. As further described herein, data may be communicated between dies of the integrated circuit system 12.

Figure 3:
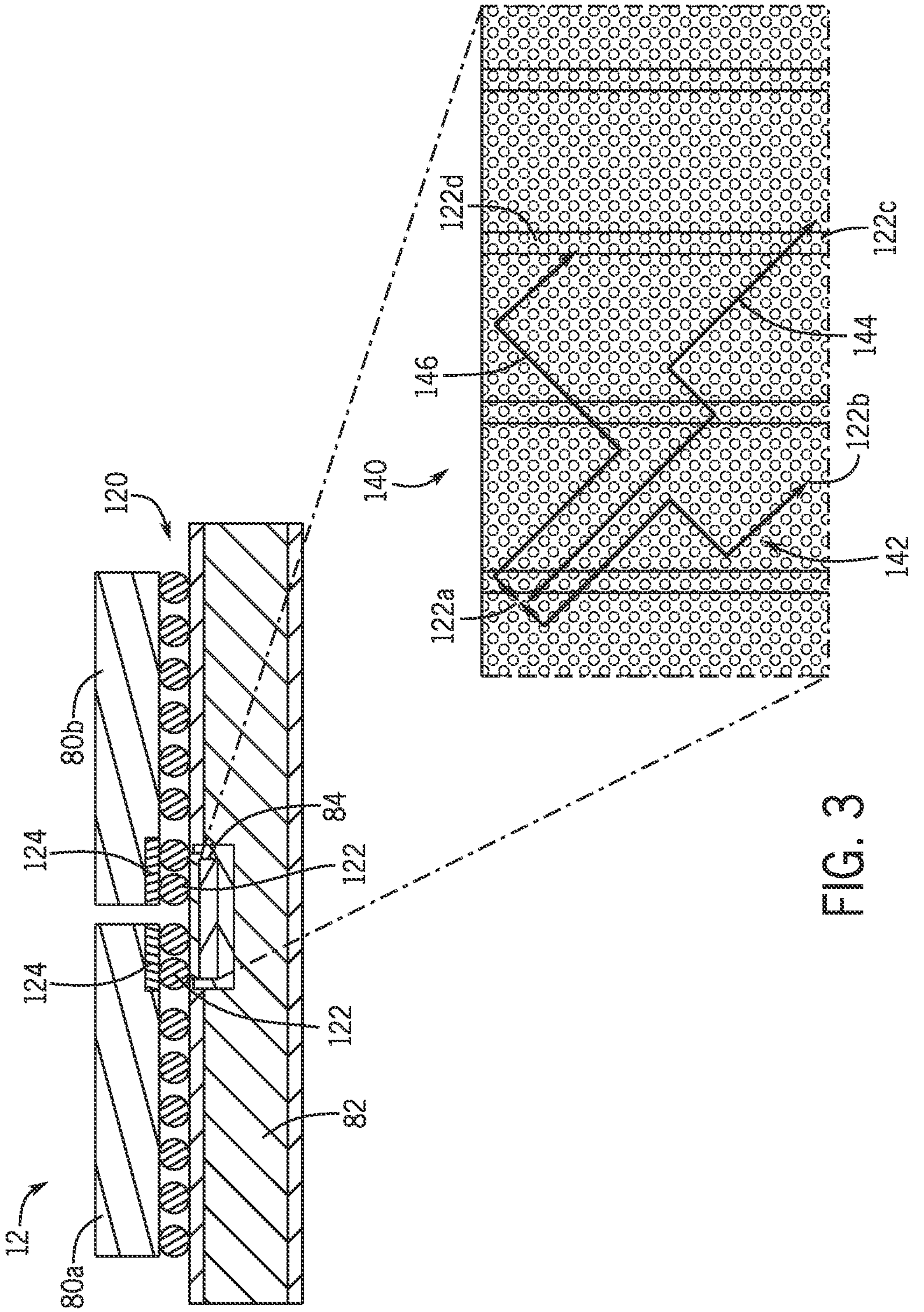
FIG. 3 is a close-up view of an example of the integrated circuit system routing data via the programmable routing bridge, in accordance with an embodiment of the present disclosure.

For example, FIG. 3 is a side-view of the integrated circuit system 12 that includes several dies 80 (here, a first die 80*a* and a second die 80*b*, though there may be any suitable number of dies 80). The dies 80 may represent any suitable integrated circuits. The dies 80 may be programmable or fixed. For example, one more of the dies 84 may include programmable logic circuitry (e.g., FPGA circuitry, artificial intelligence (AI) engines), processor circuitry (e.g., Intel® Atom®, Celeron®, Core (2) Duo®, Core i3, Core i5, Core i7, Itanium®, Pentium®, Xeon® or Xeon Phi® processors, ARM processors, or similar processors), and/or any other suitable integrated circuits. The dies 80*a* and 80*b* may be the same or different. The dies 80*a* and 80*b* are communicatively coupled for die-to-die communication by a programmable routing bridge 84. The first die 80*a* and the second die 80*b* may be mounted to the substrate 82 via bumps such as controlled collapse chip connection (C4) bumps 120 (sometimes referred to as flip-chip bumps). Generally, C4 bumps 120 (e.g., bumps used for interfacing with off-package components) are substantially larger in size compared to microbumps 122 (e.g., bumps used for interfacing with the programmable routing bridge 84). The number of microbumps 122 is also generally much greater than the number of flip-chip bumps 120 (e.g., the ratio of the number of microbumps to the number of C4 bumps 120 may be greater than 2:1, 5:1, 10:1, etc.).

The programmable routing bridge 84 may be an embedded integrated circuit having FPGA routing circuitry in the manner of the FPGA 40 described in FIG. 2 or may be an example of the FPGA 40. For example, the programmable routing bridge 84 may include circuitry to program configuration memory to control data routing from one die 80 to another (e.g., routing circuitry that may or may not be separated into sectors). Additionally or alternatively, the programmable routing bridge 84 may be a structured ASIC having via-configurable routing circuitry programmed by selecting a particular via configuration during manufacture. Thus, the programmable routing bridge 84 as a structured ASIC may be referred to as having via-configured routing. A surface of the programmable routing bridge 84 may include patterned microbumps 122 that communicatively couple to the first die 80*a* and the second die 80*b*. For example, the first die 80*a* and the second die 80*b* may mount to the programmable routing bridge 84 via the microbumps 122. An interface 124 may be formed between the first die 80*a* and the programmable routing bridge 84 and another interface 124 may be formed between the second die 80*b* and the programmable routing bridge 84. The interface 124 may allow data to be transferred between selectable points on the first die 80*a* to selectable points on the second die 80*b* by way of the programmable routing bridge 84. For example, the interface 124 may include circuitry to communicate according to universal interface bus (UIB) or advanced interface bus (AIB) that receives data from or sends data through the microbumps 122. In another example, the interface 124 may operate as an advanced extensible interface (AXI) bridge. The interface 124 may represent any suitable interface circuitry to receive or send data through the microbumps 122. In this way, data may be transferred from the first die 80*a* at a first microbump 122 and routed through the programmable routing bridge 84 to a second microbump 122 connected to the second die 80*b*. The data may be transferred according to a mapping function programmed into the programmable routing bridge 84 by the manufacturer or the designer.

In the illustrated example, FIG. 3 provides a schematic close-up view of the microbumps 122 of the programmable routing bridge 84 routing data from a microbump 122 to another microbump 122 based on a mapping function (e.g., that defines the routing pathways across the programmable routing bridge 84). For example, a designer or a manufacturer may implement the mapping function on the programmable routing bridge 84 to route data between dies 80 of the integrated circuit system 12. The mapping function may define the various routes to be programmed into the programmable routing bridge 84 to transfer data between a first microbump 122*a* and a second microbump 122*b*, a third microbump 122*c*, and a fourth microbump 122*d*, respectively. In an embodiment, the first microbump 122*a* may be associated with the first die 80*a*, the second microbump 122*b* may be associated with the second die 80*b*, the third microbump 122*c* may be associated with the third die 80*c*, and the fourth microbump 122*d* may be associated with the fourth die 80*d*.

In the example shown in FIG. 3, mapping functions may define routes across the programmable routing bridge 84 from one microbump 122 to another microbump 122 of a microbump field 140. For example, a routing pathway 142 may route data from the first microbump 122*a* to the second microbump 122*b*. The mapping function may be determined by design software, given the constraints of the overall system design, to represent the most efficient (e.g., shortest, lowest latency, highest throughput) paths from a starting location to an end location. Indeed, for higher bandwidth between certain dies, the mapping function may define more routes between those dies as compared to between others. In the example shown in FIG. 3, data may be received by the programmable routing bridge 84 from a first microbump 122*a* associated with the first die 80*a* and routed past other microbumps 122 of the microbump field 140 to a second microbump 122*b* associated with the second die 80*b*. In some embodiments, the data may be transferred from the second microbump 122*b* back to the first microbump 122*a* via the routing pathway 142. That is, in some embodiments, the routing pathway 142 may be bidirectional. In other embodiments, the routing pathway 142 may be unidirectional for communication according to a single direction defined by the mapping function.

When the programmable routing bridge 84 uses FPGA routing circuitry to route data, the programmable routing bridge may be reprogrammed (e.g., reconfigured or partially reconfigured) based on other mapping functions. In one example, the programmable routing bridge 84 may be reprogrammed according to another mapping function that may define a routing pathway 144 to transfer data from the first microbump 122*a* to the third microbump 122*c* or vice versa. In another example, the programmable routing bridge 84 may be reprogrammed according to another mapping function that may define a routing pathway 146 to transfer data from the first microbump 122*a* to the fourth microbump 122*d* or vice versa. The programmable routing bridge 84 may be programmed or reprogrammed based on configuration data. The configuration data may be a set of configuration data that is specific to the mapping function of the programmable routing bridge 84 or that is part of configuration data for a system design of the integrated circuit system 12.

Figure 4:
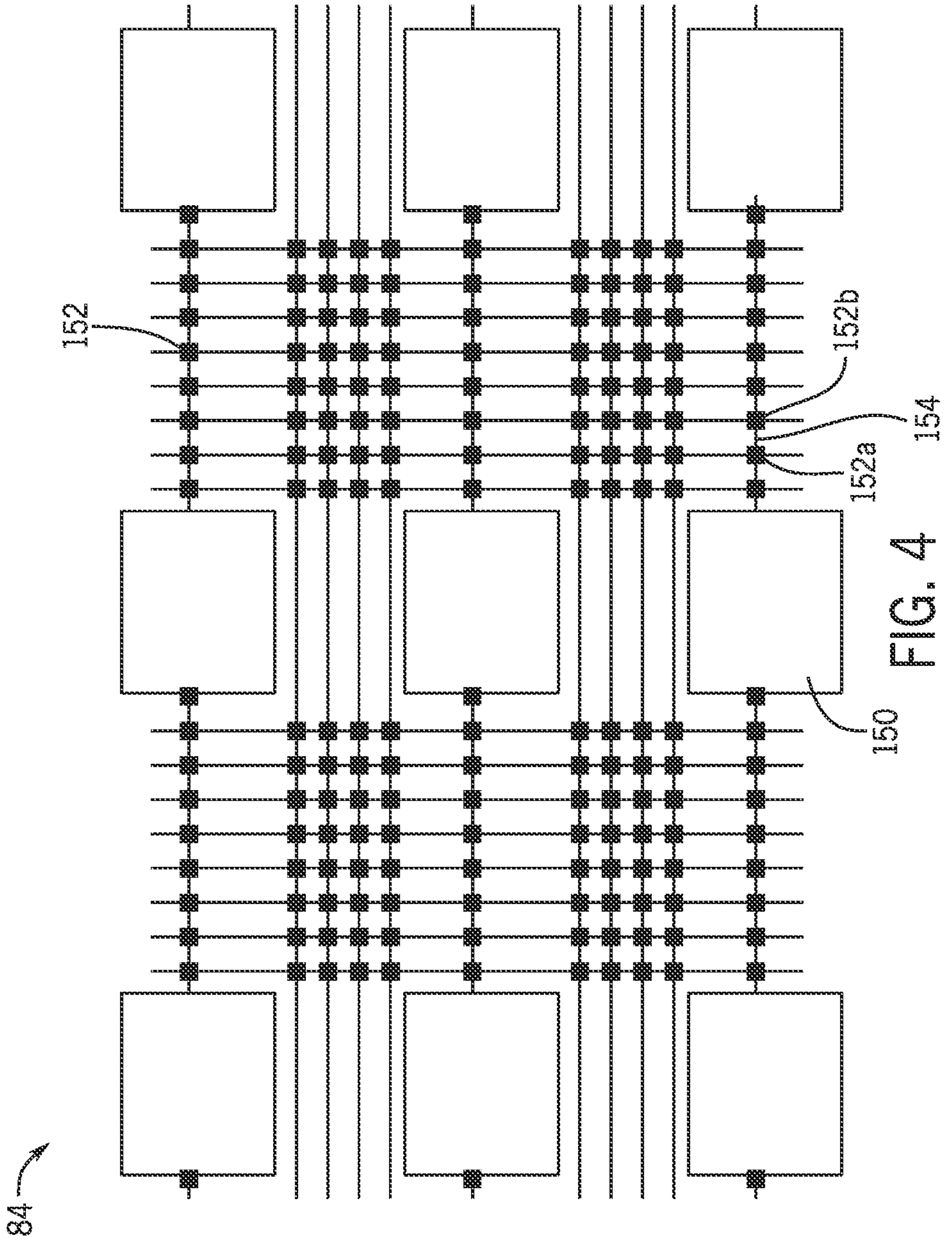
FIG. 4 is a circuit view of an example of the integrated circuit system with the programmable routing bridge, in accordance with an embodiment of the present disclosure.

FIG. 4 is a circuit block diagram view of a programmable routing layer of the programmable routing bridge 84. As described herein, the programmable routing bridge 84 may be electrically programmed to transfer data between the microbumps 122, thereby routing data between the dies 80 or tiles 44 of the integrated circuit system 12. For example, configuration data based on a mapping function (e.g., defining routing pathways to transfer data) may be loaded into configuration memory of the programmable routing bridge 84 using pins and/or I/O circuitry and programmed into configuration random access memory (CRAM) of the programmable routing bridge 84.

The programmable routing bridge 84 may include ingress/egress circuitry 150 and configurable routing switches 152 connected to one another by routing wires 154 (e.g., as shown connecting two switches 152*a* and 152*b*). The ingress/egress circuitry 150 is connected to respective microbumps of the programmable routing bridge 84 and may include any suitable driver and/or receiver circuitry to receive or send data over the microbumps. The ingress/egress circuitry 150 may be configurable to pass data to or receive data from a particular configurable routing switch 152. Indeed, the values programmed into the CRAM of the programmable routing bridge 84 may define the routing behavior of the ingress/egress circuitry 150 and the configurable routing switches 152 to transmit the data in a certain direction (e.g., up, down, left, right) based on the configuration data. By programming CRAM associated with different configurable routing switches 152 with certain configuration data, routing paths through the configurable routing switches 152 and routing wires 154 may be defined across the programmable routing bridge 84. Although not expressly shown, the programmable routing bridge 84 may or may not include logic block circuitry (e.g., adaptive logic modules (ALMs), configurable logic blocks (CLBs)). Moreover, there may be more or fewer ingress/egress circuitry 150 blocks and configurable routing switches 152. Furthermore, FIG. 4 is intended to be schematic to represent one example arrangement. There may be any suitable number of configurable routing switches 152 and routing wires 154 between the various ingress/egress circuitry 150 blocks.

Figure 5:
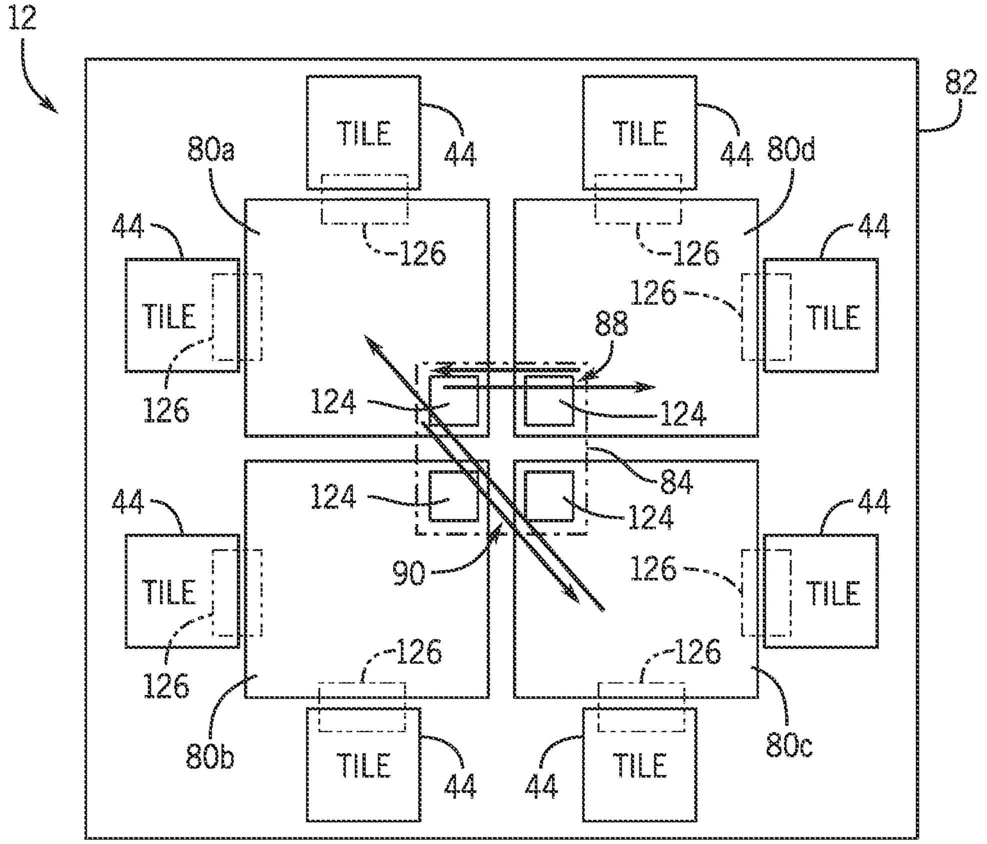
FIG. 5 is a block diagram of an example of the integrated circuit system routing data with the programmable routing bridge between four dies, in accordance with an embodiment of the present disclosure.

Using the programmable routing bridge 84, the integrated circuit system 12 may have a flexible die-to-die connection that can be programmed to support a particular application of the integrated circuit system 12. For example, FIG. 5 is a top-view of the integrated circuit system 12 with a first die 80*a*, a second die 80*b*, a third die 80*c*, and a fourth die 80*d*, which can communicate with one another through the programmable routing bridge 84. The programmable routing bridge 84 may be embedded within the substrate 82. Some part of the dies 80*a*, 80*b*, 80*c*, 80*d* may mount to the programmable routing bridge 84 forming an interface 124 between the dies and the programmable routing bridge 84 (here, within a quadrant at the corner of each die 80, though any other suitable locations may be used). The interface 124 may transfer or receive data from the microbumps 122 of the programmable routing bridge 84. Further, in the illustrated embodiment, each die 80*a*, 80*b*, 80*c*, 80*d* may be communicatively coupled to a tile 44 by an interconnect 126 to implement high-speed I/O interfaces. In one example, the interconnects 126 may be fixed interconnects, such as bridges or interposers, that transfer data according to non-programmable pathways. In other examples, the interconnects 126 may be other programmable routing bridges 84.

Returning to the example of FIG. 5, the programmable routing bridge 84 may transfer data and/or other signals between the dies 80*a*, 80*b*, 80*c*, 80*d* based on mapping functions connecting between different microbumps of the dies 80*a*, 80*b*, 80*c*, or 80*d*, thereby allowing for direct die-to-die connections (e.g., in contrast to interconnections between dies involving multiple hops). In an example, the mapping function of the configuration data may define routing pathway(s) 88 to route data from the first die 80*a* to the fourth die 80*d* in the programmable routing bridge 84. The routing pathway 88 may be bidirectional allowing the signal to be transferred to or from the first die 80*a* to or from the fourth side 80*b*. In another example, the mapping function of the configuration data may define routing pathway(s) 90 to route data from the first die 80*a* to the third die 80*c*. Accordingly, the programmable routing bridge 84 may transfer signals in a direct die-to-die connection, thereby reducing the number of hops between the dies.

Because the programmable routing bridge 84 is programmable, a different application (e.g., configuration program, use case) of the integrated circuit system 12 may use the programmable routing bridge 84 with a different configuration with a different mapping function. Likewise, a different integrated circuit system 12 having different dies 80*a*, 80*b*, 80*c*, and 80*d* may also use the programmable routing bridge 84 with a different configuration with a different mapping function. Thus, in an example shown in FIG. 6, a different mapping function may programmed into the programmable routing bridge 84 that may define routing pathway(s) 100 between the second die 80*b* and the fourth die 80*d* and routing pathway(s) 102 between the first die 80*a* and the second die 80*b*. Moreover, the size of the pathways may be adjusted to accommodate higher data rates (e.g., multiple pathways in parallel between certain dies). In this way, the programmable routing bridge 84 may accommodate a variety of different applications (e.g., use cases) or arrangements.

Figure 6:
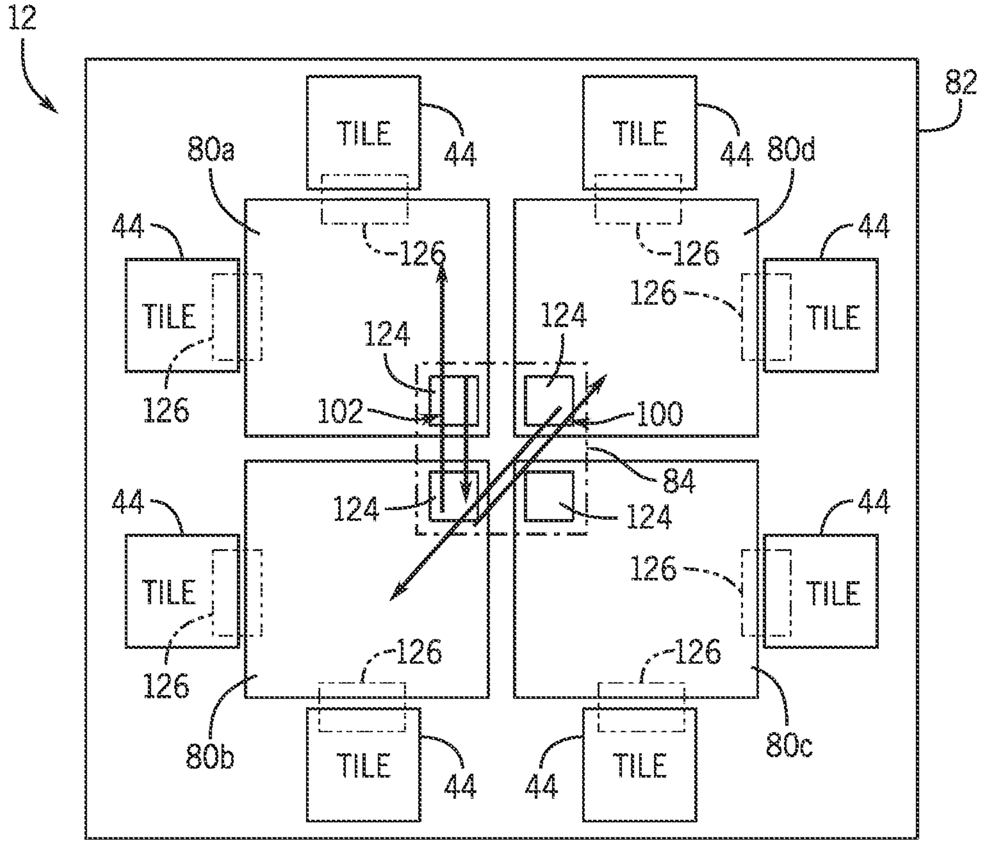
FIG. 6 is a block diagram of another example of the integrated circuit system routing data with the programmable routing bridge between four dies, in accordance with an embodiment of the present disclosure.

In addition, in FIGS. 5 and 6, the dies 80_a_, 80_b_, 80_c_, 80_d_ may also couple to one or more tiles 44 with a respective interconnect 126 for implementing high speed I/O interfaces. As described with respect to FIG. 5, the interconnect 126 may be a fixed interconnect (e.g., bridge or interposer) or a version of the programmable routing bridge 84. Moreover, while the illustrated embodiments of FIGS. 5 and 6 depict the integrated circuit system 12 with four dies, as shown by examples in FIGS. 7-9, the integrated circuit system 12 may any suitable number of dies, such as 2 dies (FIG. 7), 3 dies (FIG. 8), or 6 dies (FIG. 9) or other arrangements with more or fewer dies communicatively coupled with the programmable routing bridge 84 or multiple programmable routing bridges 84.

Figure 7:
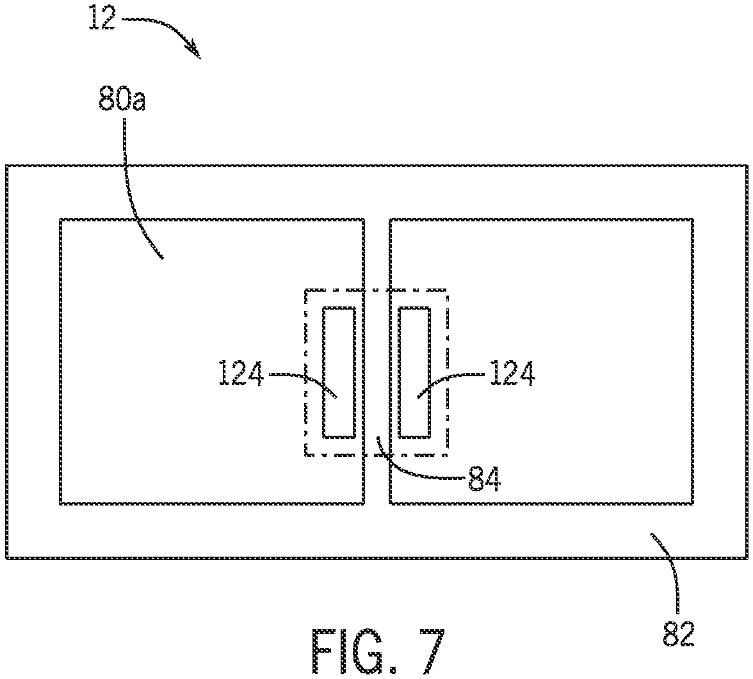
FIG. 7 is a block diagram of another example of the integrated circuit system routing data with the programmable routing bridge between two dies, in accordance with an embodiment of the present disclosure.

For example, FIG. 7 illustrates the integrated circuit system 12 with two dies 80_a_ and 80_b_ communicatively coupled to the programmable routing bridge 84. In the illustrated example, the first die 80_a_ may be adjacent to the second die 80_b_ in a 2×1 arrangement; however, the first die 80_a_ and the second die 80_b_ may instead have a 1×2 arrangement. An area (here, near the right edge) of the first die 80_a_ may have an interface 124 to couple to part of the programmable routing bridge 84 and an area (here, near the left edge) of the second die 80_b_ may have an interface 124 to couple to part of the programmable routing bridge 84. Accordingly, data may be transferred between the first die 80_a_ and the second die 80_b_ through the programmable routing bridge 84.

The first die 80_a_ and the second die 80_b_ may be mounted to any location of the programmable routing bridge 84. During manufacturing, the manufacturer may create the first die 80_a_ and the second die 80_b_ at the same time. The manufacturer may rotate the first die 80_a_ by 180 degrees to create the second die 80_b_. In other words, the first die 80_a_ and the second die 80_b_ may be identical (or nearly identical) dies. Further, the manufacturer may mount the first die 80_a_ and the second die 80_b_ to any location of the programmable routing bridge 84, thereby reducing the number of manufacturing steps involved in creating the integrated circuit system 12.

Figure 8:
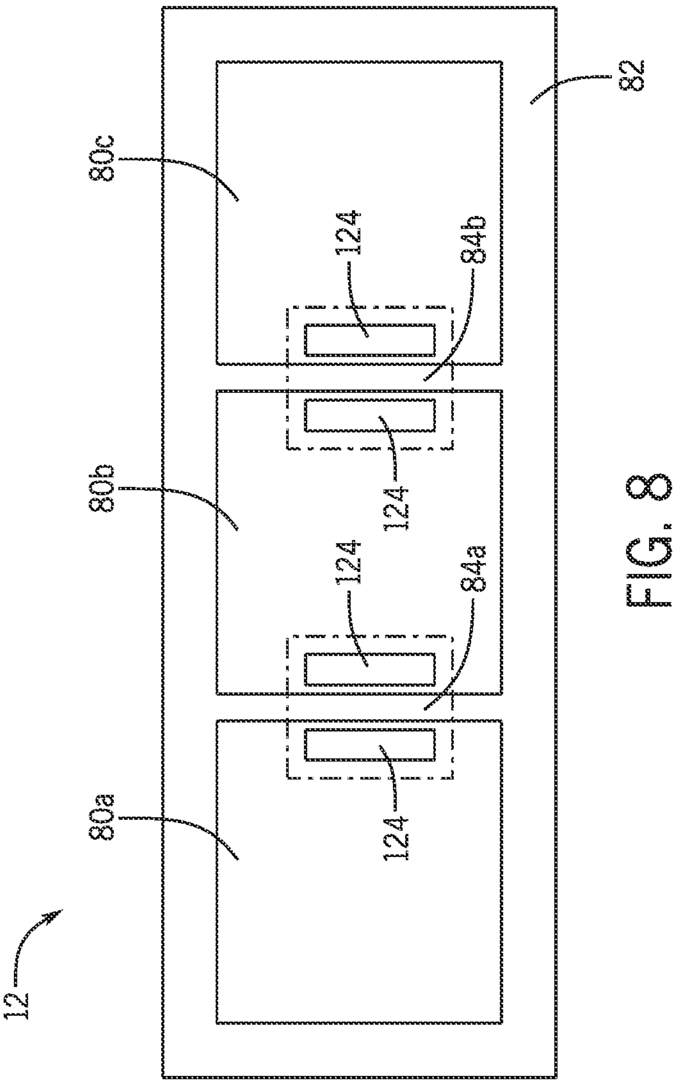
FIG. 8 is a block diagram of another example of the integrated circuit system routing data with the programmable routing bridge between three dies, in accordance with an embodiment of the present disclosure.

In the example of FIG. 8, the integrated circuit system 12 may include three dies communicatively coupled by the programmable routing bridge 84. The three dies 80_a_, 80_b_, 80_c_ may be arranged in a 3×1 arrangement; however, the dies may also be arranged in a 1×3 arrangement. For example, the integrated circuit system 12 may include a first programmable routing bridge 84_a_ interfacing with the first die 80_a_ and the second die 80_b_ and a second programmable routing bridge 84_b_ interfacing with the second die 80_b_ and the third die 80_c_. In other examples, there may be a single programmable routing bridge 84 that extends from the first die 80_a_ across the second die 80_b_ to the third die 80_c_. As shown in FIG. 8, an area (here, near a right edge) of the first die 80_a_ and an area (here, near the left edge) of the second die 80_b_ may form respective interfaces 124 with the first programmable routing bridge 84_a_. As such, the first die 80_a_ and the second die 80_b_ may be communicatively coupled according to any suitable mapping function linking die-to-die pathways from the first die 80_a_ to the second die 80_b_. Another area (here, near a right edge) of the second die 80_b_ and an area (here, near the left edge) of the third die 80_c_ may form another set of interfaces 124 with the second programmable routing bridge 84_b_. As such, the second die 80_b_ and the third die 80_c_ may be communicatively coupled according to any suitable mapping function linking die-to-die pathways from the second die 80_a_ to the third die 80_c_, which may differ from the mapping function of the first programmable routing bridge 84_a_. Data may be transferred from the first die 80_a_ to the third die 80_c_ through the second die 80_b_.

Thus, in some cases, the first die 80_a_ may be identical or nearly identical to the third die 80_c_. When creating the integrated circuit system 12, the manufacturer may rotate the first die 80_a_ by 180 degrees to get the third die 80_c_. As such, the manufacturer may avoid manufacturing separate right-handed and left-handed dies to accommodate a fixed interconnect bridge. Accordingly, the programmable routing bridge 84 may decrease manufacturing complexity and increase cost-efficiency by allowing the dies to communicatively couple at any location.

Figure 9:
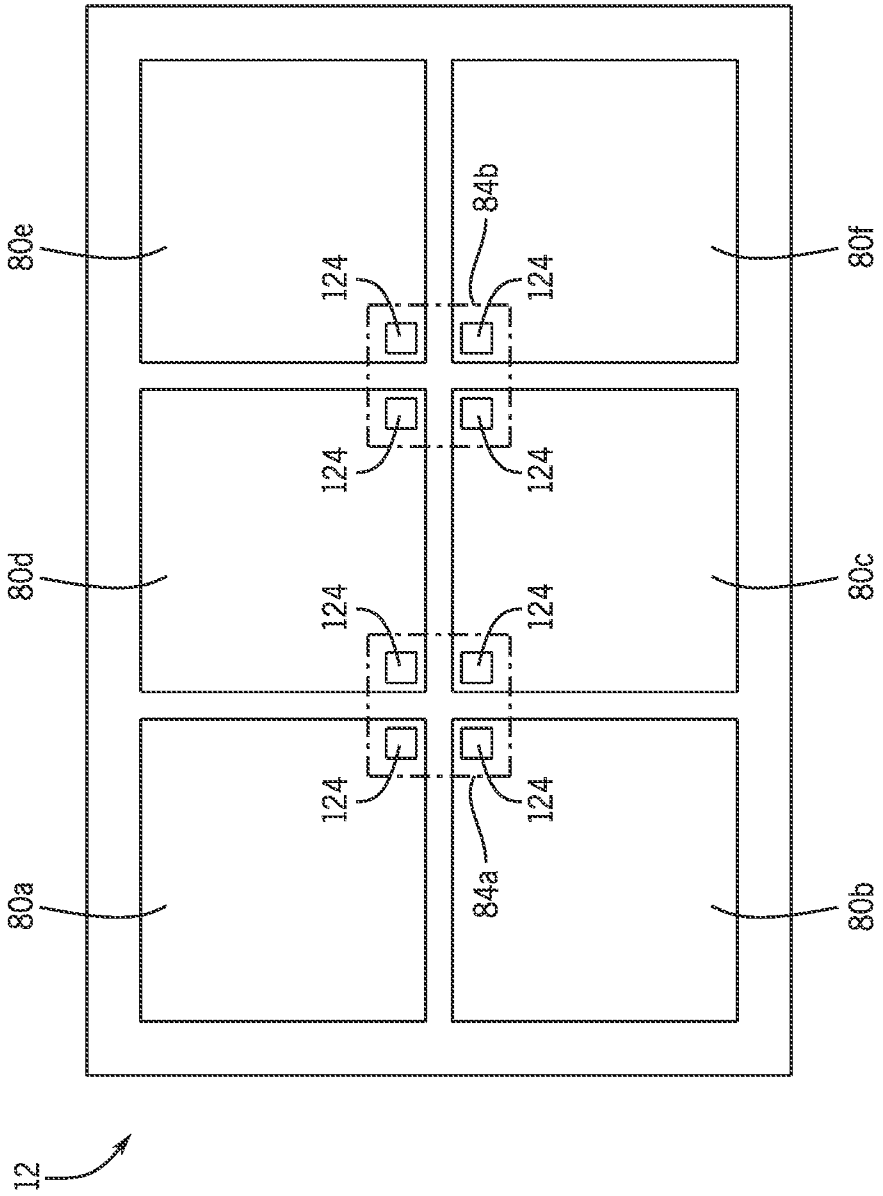
FIG. 9 is a block diagram of another example of the integrated circuit system routing data with the programmable routing bridge between six dies, in accordance with an embodiment of the present disclosure.

In another example of FIG. 9, the integrated circuit system 12 may include six dies communicatively coupled by a first programmable routing bridge 84_a_ and a second programmable routing bridge 84_b_. In other examples, there may be a single programmable routing bridge 84 that extends across areas of all of the dies 80_a_, 80_b_, 80_c_, 80_d_, 80_e_, and 80_f_. A corner of each die within the integrated circuit system 12 may interface with a programmable routing bridge 84 to transfer data, as described with respect to the examples of FIGS. 5 and 6.

In the illustrative example of FIG. 9, the dies 80_a_, 80_b_, 80_c_, 80_d_, 80_e_, and 80_f_ are arranged in a 3×2 arrangement, though any other suitable arrangement may be used. A first programmable routing bridge 84_a_ may be embedded within the substrate 82 and may communicatively couple a first die 80_a_, a second die 80_b_, a third die 80_c_, and a fourth die 80_d_. The dies 80_a_, 80_b_, 80_c_, 80_d_ may each form an interface 124 with the first programmable routing bridge 84_a_. A second programmable routing bridge 84_b_ may also be embedded within the substrate 82 and may communicatively couple the third die 80_c_, the fourth die 80_d_, a fifth die 80_e_, and a sixth 80_f_. The data may be routed between the dies based on mapping functions that may be different in the first programmable routing bridge 84_a_ and the second programmable routing bridge 84_b_. Data may be routed between the two programmable routing bridge 84_a_, 84_b_ through the third die 80_c_ and the fourth die 80_d_. As such, there may be two hops between the first die 80_a_ and the fifth die 80_e_ or the sixth die 80_f_. In another example, there may be two hops between the second die 80_b_ and the fifth die 80_e_ or the sixth die 80_f_. However, the two hops may be an improvement over five hops or six hops that may be undertaken by other systems. Accordingly, the programmable routing bridge 84 may reduce the number of hops involved in transferring data between the dies of the integrated circuit system 12.

Figure 10:
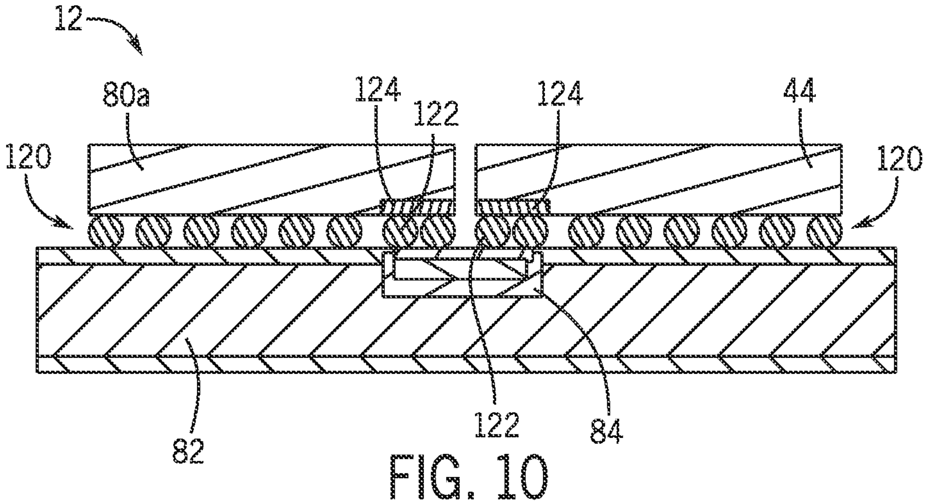
FIG. 10 is a side view of a block diagram of another example of the integrated circuit system with a die, a tile, and the programmable routing bridge, in accordance with an embodiment of the present disclosure.

The integrated circuit system 12 may also use a programmable routing bridge 84 to couple to a tile 44. FIG. 10 is a side view of the integrated circuit system 12 with the first die 80_a_ communicatively coupled to the tile 44. The example of the integrated circuit system 12 may operate in substantially the same manner as shown in FIG. 3, except that the first die 80_a_ may be connected to a tile 44 that specifically supports the first die 80_a_.

Figure 11:
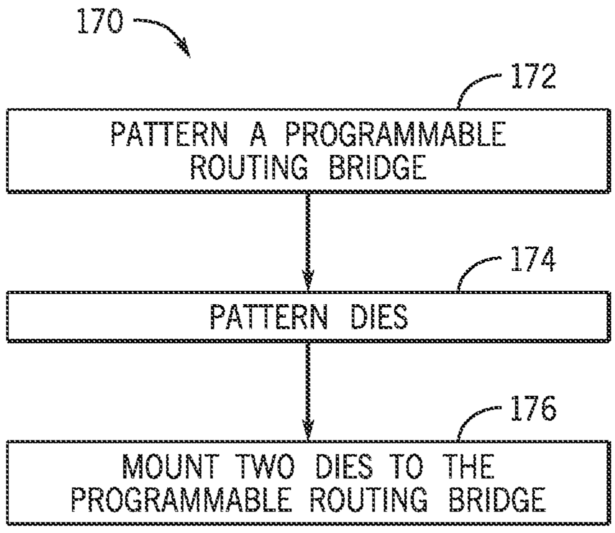
FIG. 11 is a flow diagram of a process for creating the integrated circuit system with the programmable routing bridge, in accordance with an embodiment of the present disclosure.

FIG. 11 is an example method 170 for manufacturing the integrated circuit system 12. For example, a first manufacturer may manufacture the programmable routing bridge by patterning a silicon wafer using any suitable semiconductor manufacturing process (block 172). The first manufacturer or a second manufacturer may manufacture other dies by patterning a silicon wafer using any suitable semiconductor manufacturing process (block 174). The dies may include interfaces on a portion (e.g., an area near an edge or a corner)

of the dies or on the entirety of one or more of the dies. The first manufacturer, the second manufacturer, or a third manufacturer may take the dies and mount them to the programmable routing bridge to form the integrated circuit system (block 176). The first manufacturer, the second manufacturer, the third manufacturer, or a customer may program the programmable routing bridge to provide die-to-die communication to suit any desired use case or application. When the programmable routing bridge is formed using FPGA routing circuitry, it may be programmed in the field using configuration data. When the programmable routing bridge is a structured application specific integrated circuit (ASIC) (e.g., a structured ASIC such as eASIC™ by Intel Corporation), the first manufacturer, the second manufacturer, the third manufacturer, or the customer may provide a custom design to be included when the programmable routing bridge is manufactured.

The method 170 includes various steps represented by blocks. Although the flow chart illustrates the steps in a certain sequence, it should be understood that the steps may be performed in any suitable order and certain steps may be carried out simultaneously, where appropriate. Further, certain steps or portions of the method 170 may be performed by separate systems or devices.

Figure 12:
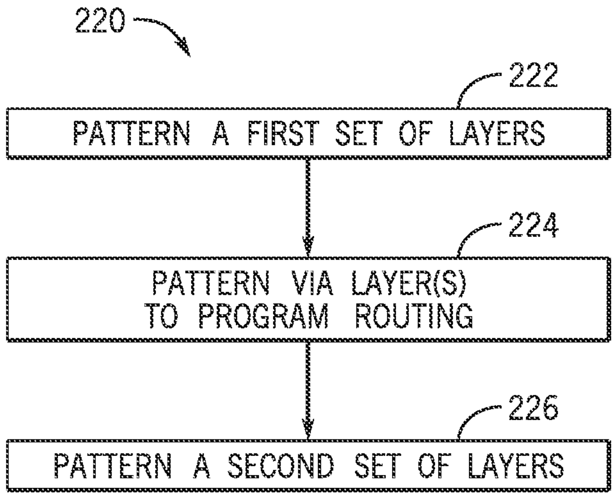
FIG. 12 is a flow diagram of a process for creating the integrated circuit system with the programmable routing bridge, in accordance with an embodiment of the present disclosure.

FIG. 12 is an example method 220 for creating the programmable routing bridge 84 as a structured application specific integrated circuit (ASIC) (e.g., a structured ASIC such as eASIC™ by Intel Corporation). At block 222, a manufacturer may pattern a wafer with a first set of masks to create a first set of layers. The first set of layers may include one or more metal layers with a number of possible locations for through silicon vias (TSVs, sometimes referred to as "vias"). A subsequent set of layers may be patterned to fill selected via locations, which effective programs the routing of the programmable routing bridge (block 224). This is because, when a second set of layers is patterned (block 226), where the via locations are filled, a connection may be formed between circuitry on the first set of layers to circuitry on the second set of layers.

For example, the first and second sets of layers may include structured logic circuit layers with via possible via locations that may be filled or unfilled in specified locations. The first and second sets of layers may be patterned using sets of masks that are reused for a variety of end products. The sets of masks to pattern the via layers, however, may be customized based on a desired mapping function. This greatly reduces the total number of masks involved in manufacturing the programmable routing bridge as a structured ASIC. Depending on which via locations are selectively filled with metal, the underlying circuitry (e.g., connection components) may change the manner in which data is routed through the programmable routing bridge. For example, the behavior of configurable routing switches formed in the first set of layers and/or the second set of layers may be defined by which via locations are filled. In this way, filling via locations may be comparable to programming CRAM.

The method 220 includes various actions represented by blocks. Although the flow chart illustrates the actions in a certain sequence, the actions may be performed in any suitable order and certain actions may be carried out simultaneously, where appropriate. Further, certain actions or portions of the method 220 may be performed by separate systems or devices.

Figure 13:
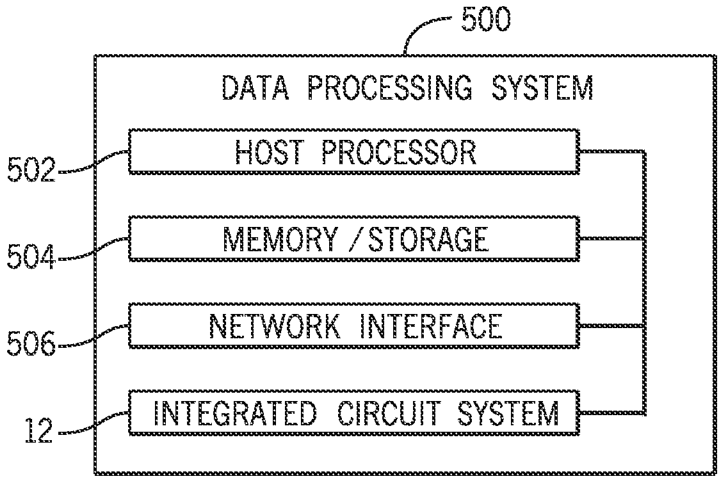
FIG. 13 is block diagram of a data processing system including an integrated circuit system with the programmable routing bridge, in accordance with an embodiment of the present disclosure.

Bearing the foregoing in mind, the integrated circuit system 12 may be a component included in a data processing system, such as a data processing system 500, shown in FIG. 13. The data processing system 500 may include the integrated circuit system 12 (e.g., a programmable logic device), a host processor 502, memory and/or storage circuitry 504, and a network interface 506. The data processing system 500 may include more or fewer components (e.g., electronic display, user interface structures, application specific integrated circuits (ASICs)). Moreover, any of the circuit components depicted in FIG. 13 may include the integrated circuit system 12 with the programmable routing bridge 84. The host processor 502 may include any of the foregoing processors that may manage a data processing request for the data processing system 500 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 504 may include random access memory (RAM), read-only memory (ROM), one or more hard drives, flash memory, or the like. The memory and/or storage circuitry 504 may hold data to be processed by the data processing system 500. In some cases, the memory and/or storage circuitry 504 may also store configuration programs (e.g., bitstreams, mapping function) for programming the integrated circuit system 12. The network interface 506 may allow the data processing system 500 to communicate with other electronic devices. The data processing system 500 may include several different packages or may be contained within a single package on a single package substrate. For example, components of the data processing system 500 may be located on several different packages at one location (e.g., a data center) or multiple locations. For instance, components of the data processing system 500 may be located in separate geographic locations or areas, such as cities, states, or countries.

The data processing system 500 may be part of a data center that processes a variety of different requests. For instance, the data processing system 500 may receive a data processing request via the network interface 506 to perform encryption, decryption, machine learning, video processing, voice recognition, image recognition, data compression, database search ranking, bioinformatics, network security pattern identification, spatial navigation, digital signal processing, or other specialized tasks.

The techniques and methods described herein may be applied with other types of integrated circuit systems. For example, the programmable routing bridge described herein may be used with central processing units (CPUs), graphics cards, hard drives, or other components.

While the embodiments set forth in the present disclosure may be susceptible to various modifications and alternative forms, specific embodiments have been shown by way of example in the drawings and have been described in detail herein. However, the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

EXAMPLE EMBODIMENT 1. An integrated circuit system comprising: a first die on a substrate; a second die on the substrate; and a programmable routing bridge embedded in the substrate, wherein the programmable routing bridge is mounted to the first die and the second die, and wherein the programmable routing bridge is configurable to transfer data between selectable points of the first die and selectable points of the second die.

EXAMPLE EMBODIMENT 2. The integrated circuit system of example embodiment 1, wherein the programmable routing bridge comprises a microbump array to communicatively couple to a first interface of the first die and a second interface of the second die.

EXAMPLE EMBODIMENT 3. The integrated circuit system of example embodiment 2, wherein the first interface and the second interface comprise advanced interface bus (AIB) circuitry, universal interface bus (UIB) circuitry, or advanced extensible interface (AXI) circuitry to transfer data to and receive data from the microbump array of the programmable routing bridge.

EXAMPLE EMBODIMENT 4. The integrated circuit system of example embodiment 1, comprising a third die on the substrate, wherein the programmable routing bridge is mounted to the third die, and wherein the programmable routing bridge is configurable to transfer data between selectable points of the third die to selectable points of the first die or selectable points of the second die.

EXAMPLE EMBODIMENT 5. The integrated circuit system of example embodiment 4, wherein the first die, the second die, and the third die are disposed in a 3×1 or 1×3 arrangement on the substrate, and wherein the integrated circuit system comprises: another programmable routing bridge embedded in the substrate, wherein the other programmable routing bridge is mounted to the second die and the third die, and wherein the other programmable routing bridge is configurable to transfer data between selectable points of the second die and selectable points of the third die.

EXAMPLE EMBODIMENT 6. The integrated circuit system of example embodiment 4, comprising a fourth die on the substrate, wherein the first die, the second die, the third die, and the fourth die are disposed in a 2×2 arrangement on the substrate, and wherein the programmable routing bridge is configurable to transfer data between selectable points of the first die, selectable points of the second die, selectable points of the third die, and selectable points of the fourth die.

EXAMPLE EMBODIMENT 7. The integrated circuit system of example embodiment 6, wherein the programmable routing bridge is communicatively coupled to a first interface of the first die, a second interface of the second die, a third interface of the third die, and a fourth interface of the fourth die.

EXAMPLE EMBODIMENT 8. The integrated circuit system of example embodiment 7, wherein the first interface of the first die is in one quadrant of the first die, the second interface of the second die is in one quadrant of the second die, the third interface of the third die is in one quadrant of the third die, and the fourth interface of the fourth die is in one quadrant of the fourth die.

EXAMPLE EMBODIMENT 9. The integrated circuit system of example embodiment 7, wherein the first die, the second die, the third die, and the fourth die are identical.

EXAMPLE EMBODIMENT 10. The integrated circuit system of example embodiment 1, comprising: a third die on the substrate; a fourth die on the substrate; a fifth die on the substrate; a sixth die on the substrate; and another programmable routing bridge embedded in the substrate; wherein the programmable routing bridge is mounted to the first die, the second die, the third die, and the fourth die, and wherein the programmable routing bridge is configurable to transfer data between selectable points of the first die, selectable points of the second die, selectable points of the third die, and selectable points of the fourth die; and wherein the other programmable routing bridge is mounted to the third die, the fourth die, the fifth die, and the sixth die, and wherein the programmable routing bridge is configurable to transfer data between selectable points of the third die, selectable points of the fourth die, selectable points of the fifth die, and selectable points of the sixth die.

EXAMPLE EMBODIMENT 11. The integrated circuit system of example embodiment 1, wherein at least one of the first die or the second die comprises field programmable gate array circuitry.

EXAMPLE EMBODIMENT 12. The integrated circuit system of example embodiment 1, wherein at least one of the first die or the second die comprises a processor.

EXAMPLE EMBODIMENT 13. An integrated circuit system comprising: a first die on a substrate; a second die on the substrate; and a programmable routing bridge embedded in the substrate, wherein the programmable routing bridge is mounted to the first die and the second die, and wherein the programmable routing bridge is via-configured to transfer data between defined points of the first die and defined points of the second die.

EXAMPLE EMBODIMENT 14. The integrated circuit system of example embodiment 13, comprising a third die and a fourth die mounted to the programmable routing bridge, and wherein the programmable routing bridge is configured to transfer data between defined points of the third die and defined points of the fourth die.

EXAMPLE EMBODIMENT 15. An article of manufacture comprising one or more tangible, non-transitory, machine-readable media having instructions stored thereon that, when executed by one or more processors, cause the one or more processors to: generate configuration data; and transfer the configuration data to an integrated circuit system that includes a programmable routing bridge connected to a first die and a second die in a package to cause the programmable routing bridge to become configured to transfer data between the first die and the second die.

EXAMPLE EMBODIMENT 16. The article of manufacture of example embodiment 15, wherein the instructions to generate the configuration data comprise instructions that, when executed, cause the one or more processors to generate the configuration data according to a first mapping function that defines a first set of die-to-die pathways between the first die and the second die.

EXAMPLE EMBODIMENT 17. The article of manufacture of example embodiment 16, wherein: the instructions to generate the configuration data comprise instructions that, when executed, cause the one or more processors to also generate the configuration data according to a second mapping function different from the first mapping function that defines a second set of die-to-die pathways between the first die and the second die; and the instructions to transfer the configuration data comprise instructions that, when executed, cause the one or more processors to transfer the configuration data to the integrated circuit system to cause the programmable routing bridge to become configured to transfer data between the first die and the second die according to the first mapping function or the second mapping function.

EXAMPLE EMBODIMENT 18. The article of manufacture of example embodiment 15, wherein: the instructions to generate the configuration data comprise instructions that, when executed, cause the one or more processors to generate the configuration data based on a system design corresponding to a configuration of programmable logic circuitry of the first die or the second die; and the instructions to transfer the configuration data to the integrated circuit system comprise instructions that, when executed, cause the one or more processors to transfer the configuration data to the integrated circuit system to cause the programmable logic circuitry of the first die or the second die to be configured with the system design.

EXAMPLE EMBODIMENT 19. A method comprising: at a first time, programming a programmable routing bridge of an integrated circuit to provide in-package die-to-die communication between a first die and a second die according to a first mapping function; and at a second time, programming the programmable routing bridge of the integrated circuit to provide in-package die-to-die communication between the first die and the second die according to a second mapping function.

EXAMPLE EMBODIMENT 20. The method of example embodiment 19, wherein the first mapping function and the second mapping function causes the programmable routing bridge to be programmed to provide different pathways between the first die and the second die.

EXAMPLE EMBODIMENT 21. A programmable routing bridge comprising: a plurality of configurable routing switches; a plurality of routing wires coupled to the configurable routing switches; and a plurality of ingress or egress circuits coupled to the plurality of routing wires, wherein the ingress or egress circuits are to connect to a first die of an integrated circuit system package and a second die of an integrated circuit system package; wherein the configurable routing switches are configurable to route data received from the first die via a first of the plurality of ingress or egress circuits to the second die via a second of the plurality of ingress or egress circuits.

EXAMPLE EMBODIMENT 22. The programmable routing bridge of example embodiment 21, wherein the plurality of configurable routing switches are configurable by configuration data stored in configuration random access memory.

EXAMPLE EMBODIMENT 23. The programmable routing bridge of example embodiment 21, wherein the plurality of configurable routing switches are via-configurable at manufacture.

What is claimed is:

1. An integrated circuit system comprising:

a first die on a substrate comprising a first interface;

a second die on the substrate comprising a second interface, wherein the first interface and the second interface comprise advanced interface bus (AIB) circuitry, universal interface bus (UIB) circuitry, or advanced extensible interface (AXI) circuitry; and a programmable routing bridge embedded in the substrate, wherein the programmable routing bridge is mounted to the first die and the second die, and wherein the programmable routing bridge is configurable to transfer data between selectable points of the first die and selectable points of the second die.

2. The integrated circuit system of claim 1, wherein the programmable routing bridge comprises a microbump array to communicatively couple to the first interface of the first die and the second interface of the second die.

3. The integrated circuit system of claim 2, wherein the first interface and the second interface are configured to transfer data to the microbump array of the programmable routing bridge and receive data from the microbump array of the programmable routing bridge.

4. The integrated circuit system of claim 1, comprising a third die on the substrate, wherein the programmable routing bridge is mounted to the third die, and wherein the programmable routing bridge is configurable to transfer data between selectable points of the third die to selectable points of the first die or selectable points of the second die.

5. The integrated circuit system of claim 4, wherein the first die, the second die, and the third die are disposed in a 3×1 or 1×3 arrangement on the substrate, and wherein the integrated circuit system comprises another programmable routing bridge embedded in the substrate, wherein the other programmable routing bridge is mounted to the second die and the third die, and wherein the other programmable routing bridge is configurable to transfer data between selectable points of the second die and selectable points of the third die.

6. The integrated circuit system of claim 4, comprising a fourth die on the substrate, wherein the first die, the second die, the third die, and the fourth die are disposed in a 2×2 arrangement on the substrate, and wherein the programmable routing bridge is configurable to transfer data between selectable points of the first die, selectable points of the second die, selectable points of the third die, and selectable points of the fourth die.

7. The integrated circuit system of claim 6, wherein the programmable routing bridge is communicatively coupled to a first interface of the first die, a second interface of the second die, a third interface of the third die, and a fourth interface of the fourth die.

8. The integrated circuit system of claim 7, wherein the first interface of the first die is in one quadrant of the first die, the second interface of the second die is in one quadrant of the second die, the third interface of the third die is in one quadrant of the third die, and the fourth interface of the fourth die is in one quadrant of the fourth die.

9. The integrated circuit system of claim 7, wherein the first die, the second die, the third die, and the fourth die are identical.

10. The integrated circuit system of claim 1, comprising:

a third die on the substrate;

a fourth die on the substrate;

a fifth die on the substrate;

a sixth die on the substrate; and another programmable routing bridge embedded in the substrate;

wherein the programmable routing bridge is mounted to the first die, the second die, the third die, and the fourth die, and wherein the programmable routing bridge is configurable to transfer data between selectable points of the first die, selectable points of the second die, selectable points of the third die, and selectable points of the fourth die; and wherein the other programmable routing bridge is mounted to the third die, the fourth die, the fifth die, and the sixth die, and wherein the programmable routing bridge is configurable to transfer data between selectable points of the third die, selectable points of the fourth die, selectable points of the fifth die, and selectable points of the sixth die.

11. The integrated circuit system of claim 1, wherein at least one of the first die or the second die comprises field programmable gate array circuitry.

12. The integrated circuit system of claim 1, wherein at least one of the first die or the second die comprises a processor.

13. An integrated circuit system comprising:

a first die on a substrate;

a second die on the substrate; and a via-configured structured application specific integrated circuit programmable routing bridge embedded in the substrate, wherein the via-configured structured application specific integrated circuit programmable routing bridge is mounted to the first die and the second die, and wherein the via-configured structured application specific integrated circuit programmable routing bridge is via-configured to transfer data between defined points of the first die and defined points of the second die.

14. The integrated circuit system of claim 13, comprising a third die and a fourth die mounted to the via-configured structured application specific integrated circuit programmable routing bridge, and wherein the via-configured structured application specific integrated circuit programmable routing bridge is configured to transfer data between defined points of the third die and defined points of the fourth die.

15. An article of manufacture comprising one or more tangible, non-transitory, machine-readable media having instructions stored thereon that, when executed by one or more processors, cause the one or more processors to:

generate configuration data;

transfer the configuration data to an integrated circuit system that includes a programmable routing bridge connected to a first die and a second die in a package to cause the programmable routing bridge to become configured to transfer data between the first die and the second die; and partially reconfigure the programmable routing bridge based on a mapping function, wherein the mapping function defines a routing pathway to transfer data between the first die and the second die.

16. The article of manufacture of claim 15, wherein the instructions to generate the configuration data comprise instructions that, when executed, cause the one or more processors to generate the configuration data according to a first mapping function that defines a first set of die-to-die pathways between the first die and the second die.

17. The article of manufacture of claim 16, wherein:

the instructions to generate the configuration data comprise instructions that, when executed, cause the one or more processors to also generate the configuration data according to a second mapping function different from the first mapping function that defines a second set of die-to-die pathways between the first die and the second die; and the instructions to transfer the configuration data comprise instructions that, when executed, cause the one or more processors to transfer the configuration data to the integrated circuit system to cause the programmable routing bridge to become configured to transfer data between the first die and the second die according to the first mapping function or the second mapping function.

18. The article of manufacture of claim 15, wherein:

the instructions to generate the configuration data comprise instructions that, when executed, cause the one or more processors to generate the configuration data based on a system design corresponding to a configuration of programmable logic circuitry of the first die or the second die; and the instructions to transfer the configuration data to the integrated circuit system comprise instructions that, when executed, cause the one or more processors to transfer the configuration data to the integrated circuit system to cause the programmable logic circuitry of the first die or the second die to be configured with the system design.

* * * * *